(12) United States Patent
Roger et al.

(10) Patent No.: US 12,019,177 B2
(45) Date of Patent: Jun. 25, 2024

(54) METHOD OF COMPRESSING RADAR DATA USING FREQUENCY BINS

(71) Applicant: Infineon Technologies AG, Neubiberg (DE)

(72) Inventors: Andre Roger, Munich (DE); Markus Bichl, Feldkirchen-Westerham (DE); Dian Tresna Nugraha, Bandung (ID); Romain Ygnace, Brunnthal (DE)

(73) Assignee: Infineon Technologies AG, Neubiberg (DE)

( * ) Notice: Subject to any disclaimer, the term of this patent is extended or adjusted under 35 U.S.C. 154(b) by 531 days.

(21) Appl. No.: 17/038,259

(22) Filed: Sep. 30, 2020

(65) Prior Publication Data

US 2021/0116535 A1    Apr. 22, 2021

(30) Foreign Application Priority Data

Oct. 16, 2019 (DE) ...................... 10 2019 127 922.4

(51) Int. Cl.
*G01S 7/292* (2006.01)
*G01S 7/288* (2006.01)
(Continued)

(52) U.S. Cl.
CPC ............ *G01S 7/2923* (2013.01); *G01S 7/288* (2013.01); *G01S 7/4008* (2013.01); *G01S 7/41* (2013.01);
(Continued)

(58) Field of Classification Search
CPC ...... G01S 7/2923; G01S 7/288; G01S 7/4008; G01S 7/41; G01S 13/505; G01S 7/2883; G01S 13/42
See application file for complete search history.

(56) References Cited

U.S. PATENT DOCUMENTS 10,416,284 B2    9/2019  Addison et al.
10,520,584 B2   12/2019  Wintermantel
(Continued)

FOREIGN PATENT DOCUMENTS

JP    2003240845 A    8/2003
JP    2008089315 A    4/2008
(Continued)

*Primary Examiner* — Donald H B Braswell
(74) *Attorney, Agent, or Firm* — Eschweiler & Potashnik, LLP

(57) ABSTRACT

A method of handling radar signals of a radar system having a plurality of antennas is provided. The method may include generating a plurality of time-based radar signals based on a radar signal received by an associated antenna of the plurality of antennas, and transforming each time-based radar signal of the time-based radar signals into radar signals that each comprise a plurality of pairs of a frequency-based-value and an associated intensity value. The method includes storing the frequency-based-values and the intensity values of one frequency-based radar signal corresponding to one time-based radar signal of one antenna of the plurality of antennas; and storing each intensity value of the plurality of intensity values of another of the plurality of frequency-based radar signals based on a corresponding intensity value of the one frequency-based radar signal, wherein a stored representation of the intensity value of the other of the plurality of frequency-based radar signals has fewer bits than the corresponding stored intensity value.

19 Claims, 7 Drawing Sheets

(51) Int. Cl.
  *G01S 7/40* (2006.01)
  *G01S 7/41* (2006.01)
  *G01S 13/50* (2006.01)
  *H03M 7/24* (2006.01)
  *H03M 7/30* (2006.01)

(52) U.S. Cl.
  CPC ............ *G01S 13/505* (2013.01); *H03M 7/24* (2013.01); *H03M 7/30* (2013.01); *G01S 7/2883* (2021.05)

(56) References Cited

U.S. PATENT DOCUMENTS

| | | | |
|---|---|---|---|
| 2003/0156054 A1 | 8/2003 | Ishii et al. | |
| 2011/0099295 A1* | 4/2011 | Wegener | H03M 7/46 |
| | | | 711/170 |
| 2014/0044371 A1* | 2/2014 | Madanbashi | H03M 7/30 |
| | | | 382/244 |
| 2016/0033631 A1 | 2/2016 | Searcy | |
| 2016/0291148 A1* | 10/2016 | Ellenbogen | G01S 13/887 |
| 2017/0054449 A1* | 2/2017 | Mani | G01S 13/584 |
| 2017/0153316 A1* | 6/2017 | Wintermantel | H03M 7/24 |

FOREIGN PATENT DOCUMENTS

| | | |
|---|---|---|
| JP | 2013250122 A | 12/2013 |
| JP | 2016102787 A | 6/2016 |
| JP | 2017524898 A | 8/2017 |
| JP | 2018528420 A | 9/2018 |
| WO | 2015185058 A1 | 12/2015 |

* cited by examiner

Range or Doppler bin

METHOD OF COMPRESSING RADAR DATA USING FREQUENCY BINS

REFERENCE TO RELATED APPLICATION

This application claims priority to German Application No. 10 2019 127 922.4, filed on Oct. 16, 2019, the contents of which are hereby incorporated by reference in their entirety.

FIELD

Various embodiments relate generally to a method of handling radar signals of a radar system and to a radar system.

BACKGROUND

Radar systems typically generate large amounts of processed data that need to be stored at least temporarily. Because of high costs of memories, signal compression is usually applied to radar data.

In US 2016/0033631 A1, a radar data compression method is described. After a completion of a first stage fast fourier transform (FFT) that provides binned data for a given antenna, a compression is applied in that, for at least some bins of the binned data, a reduced data set that excludes at least one redundant sign bit is stored. This means that the compression is performed for data received by the same antenna.

This is illustrated in FIG. 1. Binned frequency-based radar data of four antennas RX0, RX1, RX2, and RX3 are shown as numbered boxes representing range- or Doppler bins. A compression direction—across the range- or Doppler bins— is indicated by a dashed box 102. Doppler is an indication for a velocity of a target, and range is an indication of a distance between the target and the radar antenna.

While allowing true signal compression, this may have drawbacks.

A main drawback may be losses in sensitivity, which may be particularly relevant in a case of multiple targets (the term "target" may refer to an object in an accessible range of the radar system). For example, one of them may be at a large distance (also referred to as range) and may have a big cross section. The target may for example be a car or a bus. This may generate a high amplitude signal at high frequencies.

As the compression is done across multiple range bins, intrinsically, the high frequency and high amplitude signal can mask a lower amplitude signal, as it may for example be generated by a pedestrian.

A case of the high frequency and high amplitude signal compromising other, unrelated bins, is shown in FIG. 6A. A result of a compression of frequency-based radar data are illustrated as a two-dimensional greyscale image 600 with range bins along an x-direction, and a chirp count along a y-direction. An intensity is represented as the greyscale, wherein generally, lighter grey represents a higher intensity. However, the black regions labelled with 660 indicate highest intensity. The bins labelled with 660 have a true, high intensity signal. Indicated with 662 are bins that have been compromised by the high intensity signal in the bins 660 in that they have a false high-intensity (or even overload) signal. If a true, e.g. lower intensity, signal had been present at those bins, it would have been undetected.

This means that a detection of pedestrians or similar small targets may become more complex.

SUMMARY

A method of handling radar signals of a radar system having a plurality of antennas is provided. The method may include generating a plurality of time-based radar signals, wherein each time-based radar signal of the plurality of time-based radar signals may be based on a radar signal received by an associated antenna of the plurality of antennas. The method also includes transforming each time-based radar signal of the time-based radar signals into a frequency-based radar signal, thereby forming a plurality of frequency-based radar signals. Each frequency-based radar signal of the frequency-based radar signals comprises a plurality of pairs of a frequency-based-value and an associated intensity value. The method further includes storing the frequency-based-values and the intensity values of one frequency-based radar signal corresponding to one time-based radar signal of one antenna of the plurality of antennas; and storing each intensity value of the plurality of intensity values of another of the plurality of frequency-based radar signals based on a corresponding intensity value of the one frequency-based radar signal. A stored representation of the intensity value of the other of the plurality of frequency-based radar signals has fewer bits than the corresponding stored intensity value.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosure. In the following description, various embodiments of the disclosure are described with reference to the following drawings, in which.

DESCRIPTION

Figure 1:
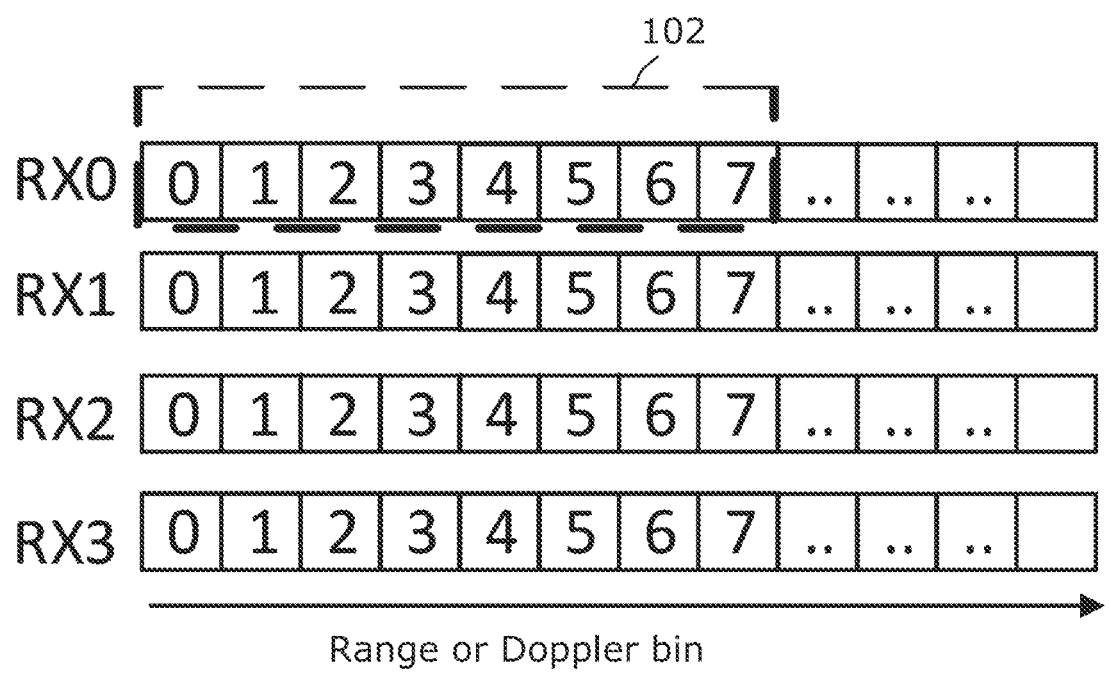
FIG. 1 illustrates a method of compressing radar data in accordance with a state of the art.
Figure 2:
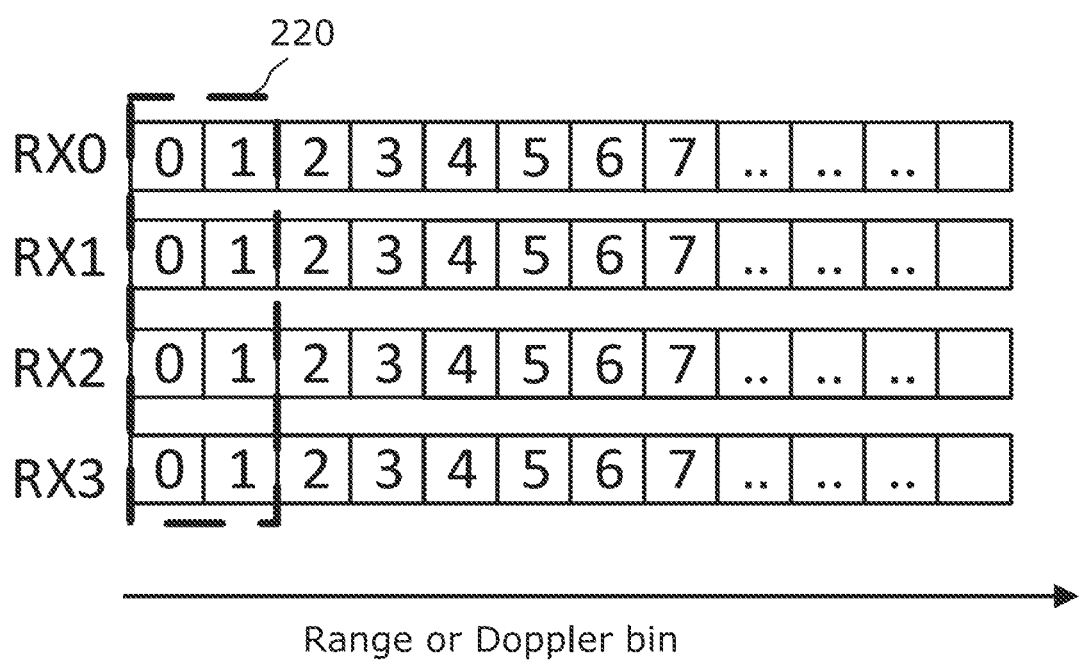
FIG. 2 illustrates a method of compressing radar data in accordance with various embodiments.

The following detailed description refers to the accompanying drawings that show, by way of illustration, specific details and embodiments in which the disclosure may be practiced.

The word "exemplary" is used herein to mean "serving as an example, instance, or illustration". Any embodiment or design described herein as "exemplary" is not necessarily to be construed as preferred or advantageous over other embodiments or designs.

Various aspects of the disclosure are provided for devices, and various aspects of the disclosure are provided for methods. It will be understood that basic properties of the devices also hold for the methods and vice versa. Therefore, for sake of brevity, duplicate description of such properties may have been omitted.

Signal compression in memory, in other words, storing the signal using a representation having fewer bits than the original representation, may be a key to enable cost competitive solutions for radar systems.

A radar signal, as it may be received by an antenna, may include an intensity as a function of time. The intensity may be received as an analog signal, which may be converted into a digital numerical value for storage and further processing. Until recently, a format for a radar signal has been integer or fractional. New computing units can support floating point, such that a compression method, i.e. a new compression method, may be required for radar.

In various embodiments, a compression of radar data may be performed across a plurality of antennas, rather than "within" a single antenna (e.g. for a plurality or range bins or for a plurality of Doppler bins). Provided that a separation between the plurality of antennas is small enough, this means that the values to be tied together during compression are more similar in the various embodiments, and hence values tied together during the compression are closer together than in the prior art.

For example, a frequency-based radar signal, e.g. of intensity vs. range, may be essentially the same for a plurality of antennas having a very small separation from each other, e.g. a few millimeters. The frequency-based radar signal of one antenna of the plurality of antennas may differ from the respective signal of another antenna of the plurality of antennas essentially only by noise, irrespective of a number of objects (targets) being in an accessible range and/or of a size of the objects (targets) and/or of a velocity of the targets.

In various embodiments, results of a transformation, e.g. an FFT across multiple antennas that may result in a binned range with associated intensities for each of the antennas, may subsequently be compressed by compressing data for a single or for very few FFT ranges. Specifically, in various embodiments, for a first antenna of the antennas, for one of the range bins, a representation of the associated intensity that requires a full number of bits may be stored, whereas for a second antenna of the other antennas, a representation of the intensity associated to the range bin that requires fewer bits may be stored. The representation of the intensity of the second antenna may require fewer bits because it is understood to be based on the first antenna. This may apply to all range bins, and similarly to all range bins of a third antenna, a fourth antenna, etc.

Figure 3A:
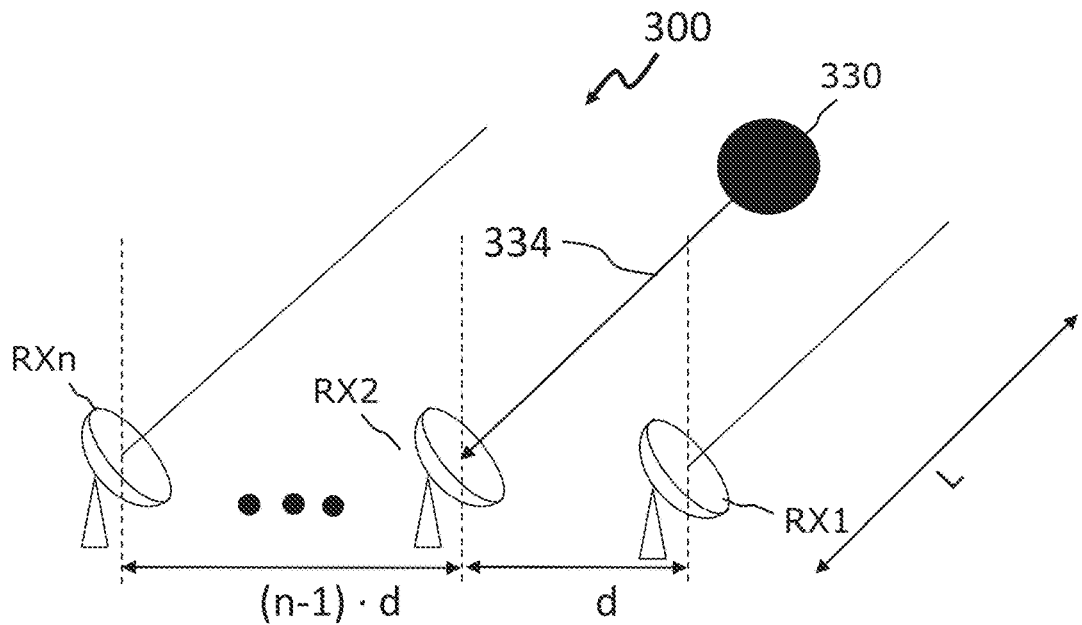
FIG. 3A is a schematic illustration of a radar system in accordance with various embodiments during operation.
Figure 3B:
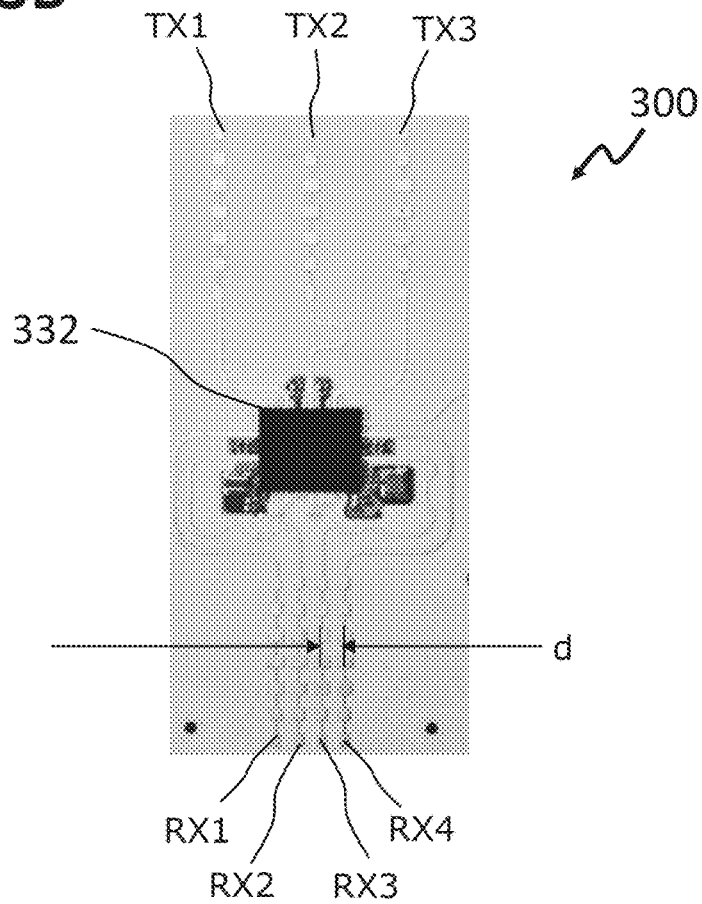
FIG. 3B shows a radar system in accordance with various embodiments.

FIG. 3A is a schematic illustration of a radar system 300 in accordance with various embodiments during operation, and FIG. 3B is a photograph of a radar system 300 in accordance with various embodiments.

As can be seen in FIG. 3A, the radar system 300 may include a plurality of antennas RX, specifically RX1, RX2, . . . RXn. The antennas RX may be configured to receive a radar signal 334 and may therefore also be referred to as receivers. In various embodiments, one or more transmitter antennas TX, for example as shown in FIG. 3B, may be separately provided in the radar system 300. In various embodiments (not shown), combined transmitter-receiver antennas may be provided.

In FIG. 3A, only the signal 334 received by the second antenna RX2 is shown to originate from a reflection off a target 330. However, in typical radar applications, and in particular in applications considered for various embodiments (for example in the automotive industry), a distance L to a target 330 may be so much larger than a separation d between adjacent antennas RX that all of the antennas RX may receive the radar signal 334 reflected off the target 330 if the target 330 is within a detectable range. For example, radar systems 330 in the automotive industry typically operate at a wavelength of $\lambda$=77 GHz. Therefore, typically, a separation d between the antennas (receivers) RX may be about $\lambda/2$, i.e. about 2 mm. FIG. 3B shows the radar system 300 having a separation d of about 2 mm between adjacent antennas RX, for example, as indicated, between the antennas RX3 and RX4. The distance L may typically be about 2 m or more, in other words, L may be approximately 1000 times as large as d, or more.

In various embodiments, the radar signal 334 that is reflected off the target 330 may originate in the radar system 300. The at least one transmitter TX may have sent a transmitted radar signal (not shown), a portion of which being reflected by the target 330. A fraction of the reflected portion may be reflected towards the radar system 300 and may be received by the antennas RX as the received radar signal 334.

The transmitted radar signal may include a plurality of chirps. Each chirp may be a signal that has its frequency increasing monotonously (or alternatively decreasing monotonously) over time.

The radar system 300 may include at least one processor 332 (see FIG. 3B) that may be configured to control an operation of the radar system 300. For example, the processor 332 may be configured to control the transmitters TX (for example for transmitting the plurality of chirps) and the antennas RX. The processor 332 may further be configured to process the received radar signals 334.

The radar system may further include a memory.

The radar system 300, for example the at least one processor 332, may be configured to generate, from the received radar signal 334, a time-based radar signal 400 as an intensity varying over time.

Figure 4:
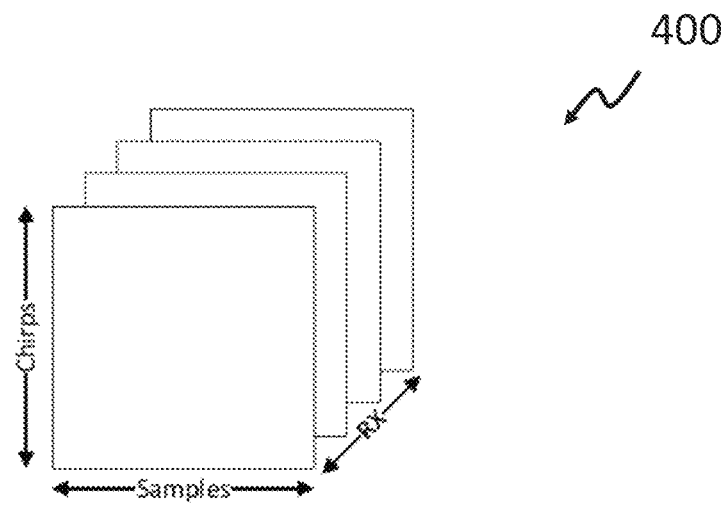
FIG. 4 shows a data cube of a time-based radar signal in accordance with various embodiments.

FIG. 4 illustrates such a time-based radar signal 400. In various embodiments, the time-based radar signal may be a data cube having the plurality of antennas RX along one axis (e.g., the z axis), time (indicated as "Samples") along a second axis (e.g., the x axis). The radar system 300 may be configured to provide a plurality of the chirps, and for each of the chirps, the time dependent intensity signal (intensity may be a value registered for each of the three-dimensional pixels) may be registered for each of the antennas RX as a function of time. Hence, in each line along the y axis, a time-dependent radar signal for one of the chirps may be stored. A total sampling time, i.e. a maximum sampling value, may correspond to a length of a chirp.

A frequency of the reflected signal 334 received at a given point in time may depend on the distance L to the target 330: The signal of a given frequency transmitted by the transmitter TX may be received after a time that it requires the signal to travel (at the speed of light) to the target 330 and back to the antennas RX.

This means that a transformation of the time-based radar signal to a frequency-based radar signal may provide information about a distance from the radar system 300 to the target 330. Furthermore, for example after further processing, e.g. a Doppler analysis, of the frequency-based signal may provide information about a relative motion of the radar system 300 and the target 330.

The radar system 300 may be configured to transform the time-based radar signal 400 to a frequency-based radar signal. For each of the plurality of chirps, and for each of the plurality of antennas RX, an individual frequency-based radar signal RXnCmf may be generated, wherein n is a placeholder for a number of the antenna RX, and m is a placeholder for the chirp number.

Figure 5:
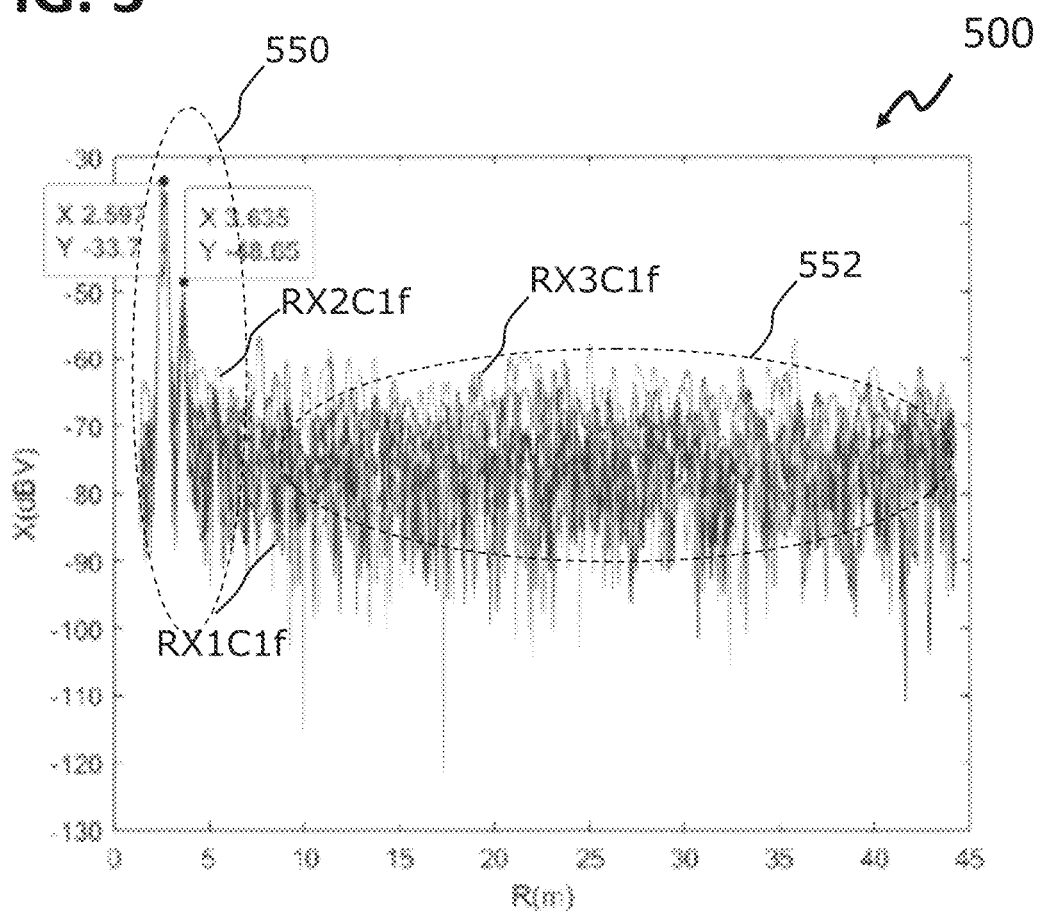
FIG. 5 shows frequency-based radar signals of a plurality of antennas generated by a method of handling radar signals in accordance with various embodiments.

In FIG. 5, frequency-based radar signals RX1C1f, RX2C1f, and RX3C1f (and some others that are not labelled) are shown, in other words, frequency-based radar signals for one of the chirps and for multiple antennas RX. A transformation from the time-based radar signal 400 to the frequency-based radar signal RXnCmf was performed by fast fourier transform (FFT). Other known frequency transformation methods may be applied instead of or in addition to FFT for the transformation of the time-based radar signals (e.g. a Doppler analysis). Since, in the frequency-based radar signal RXnCmf, the frequency, which would extend along the x axis, is equivalent to a scanned distance, the frequency axis is labelled with a sampled range R in meters. The y axis has an intensity in arbitrary logarithmic units.

As can be seen from FIG. 5, the different antennas (receivers), each of which represented by a different greyscale, have very similar spectra. This is particularly noticeable in a region 550 between approximately 1 m and approximately 6 m, where the intensity is high (and approximately identical) for all the antennas RX. This is where targets 330 are detected. Outside the range with the high intensity, e.g. in a region 552, all the antennas RX show essentially comparable amounts of noise (note the log scale of the spectra).

Thus, from FIG. 5, it can be seen that the amplitude of the frequency-based radar signal RXnCmf varies less from one antenna to the next, i.e., across antenna RX channels, than it does within each single RX channel, i.e. across the frequency (or range R, respectively) channels.

In various embodiments, as described above, the radar system 300, e.g. the processor 332, may be configured to perform a data compression across the antennas (rather than for each single antenna RX spectrum, which would mean compressing over range in the range dimension, or over Doppler bins in the Doppler dimension).

In various embodiments, the radar system 300, e.g. the processor 332, may be configured to store the same frequency-based radar signals RXnCmf (e.g., FFTs, e.g. range or Doppler), e.g. in the memory, and may be configured to compress in the antenna RX dimension only.

Figure 7:
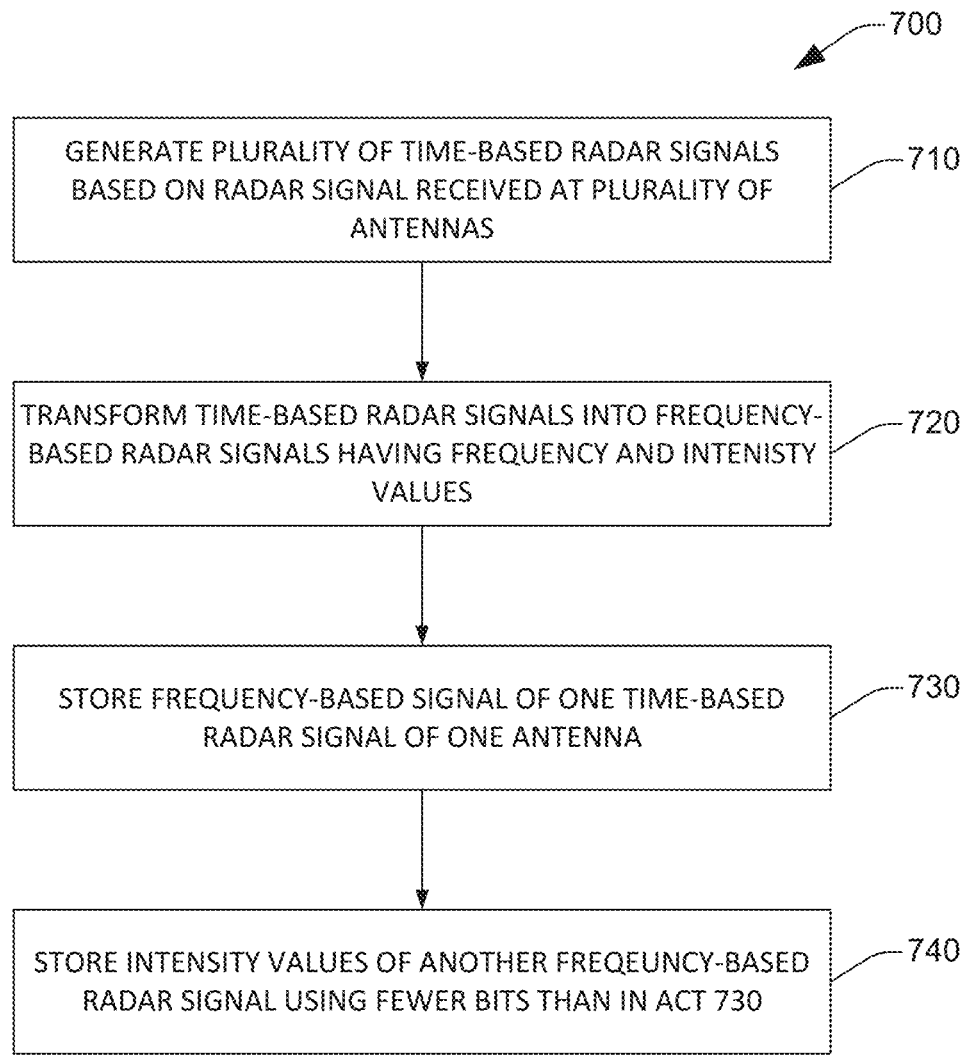
FIG. 7 shows a flow diagram of a method of handling radar signals in accordance with various embodiments.

The frequency-based radar signals RXnCmf may in various embodiments be binned along the frequency (range) dimension (see FIG. 7). For each of the plurality of antennas RX, the frequency-based signal RXnCmf may be binned into the same bins. This may make it possible that a compression, which will be described in more detail below, is done across the antenna RX dimension. This may in various embodiments be performed for a single frequency bin. As a consequence, a high frequency and high amplitude signal may have fewer chances to mask lower amplitude signal, because a probability of a 'washed-out' (e.g., overload) signal may be reduced.

In various embodiments, instead of using a single frequency bin, a small number of frequency bins may be used for the compression, for example two or three adjacent frequency bins. The number of bins used for the compression may be small compared to a total number of frequency bins, for example less than 1% of the frequency bins, e.g. less than 0.1%.

In various embodiments, in case of having only a limited number of antennas RX, for example fewer than four antennas, the compression could be performed as a mix of compressing across antennas RX and of compressing along the frequency dimension (e.g., range or Doppler). For example, the compression could be performed across two antennas, and additionally along, e.g., the frequency dimension.

In various embodiments, losses caused while compressing the frequency-based radar signal RXnCmf may be reduced avoided, e.g. by using a suitable FFT buffering scheme, as described below in context with FIG. 7 and FIG. 8. This may, in various embodiments, allow a lossless compression of the frequency-based radar signal RXnCmf.

FIG. 7 shows a flow diagram 700 of a method of handling radar signals of a radar system, e.g. the above described radar system, having a plurality of antennas in accordance with various embodiments.

The method may include generating a plurality of time-based radar signals, wherein each time-based radar signal of the plurality of time-based radar signals may be based on a radar signal received by an associated antenna of the plurality of antennas (in 710). The method also comprises transforming each time-based radar signal of the time-based radar signals into a frequency-based radar signal, thereby forming a plurality of frequency-based radar signals. Each frequency-based radar signal of the frequency-based radar signals includes a plurality of pairs of a frequency-based-value and an associated intensity value (in 720). The method also comprises storing the frequency-based-values and the intensity values of one frequency-based radar signal corresponding to one time-based radar signal of one antenna of the plurality of antennas (in 730). Lastly, the method comprises storing each intensity value of the plurality of intensity values of another of the plurality of frequency-based radar signals based on a corresponding intensity value of the one frequency-based radar signal, wherein a stored representation of the intensity value of the other of the plurality of frequency-based radar signals has fewer bits than the corresponding stored intensity value (in 740).

Figure 8:
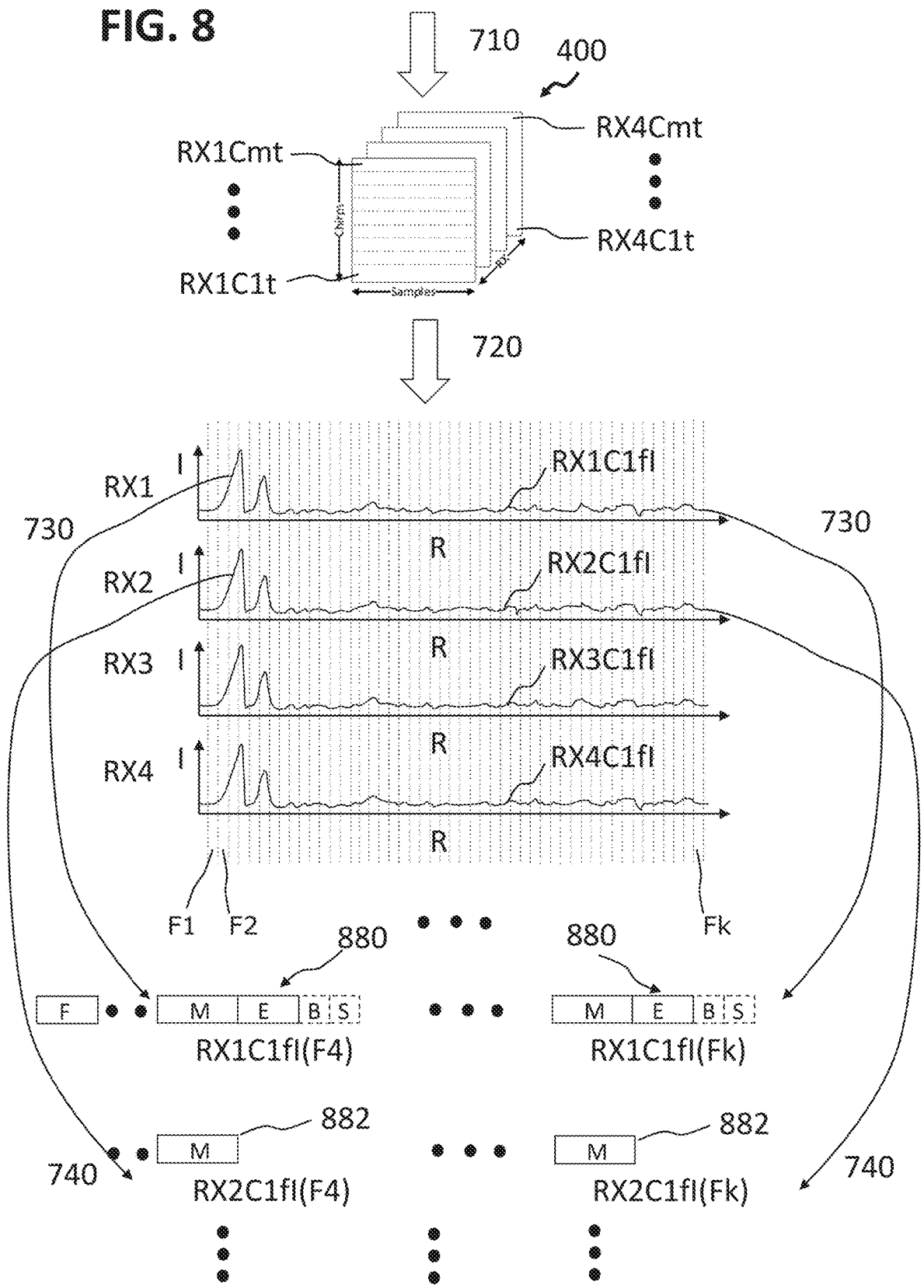
FIG. 8 shows an illustration of a method of handling radar signals in accordance with various embodiments.

FIG. 8 shows an illustration of a method of handling radar signals in accordance with various embodiments, for example of the method described above in context with FIG. 7. The radar system 300 described above in context with FIG. 2 to FIG. 5 may be configured to execute the method illustrated here.

As described above, a radar system 300 may have a plurality of antennas (receivers) RX. In the illustrated embodiment, four antennas RX1, RX2, RX3, and RX4 may be provided.

The method may include (in 710) generating a plurality of time-based radar signals RXnCmt, wherein each time-based radar signal RX1Cmt, RX2Cmt, RX3Cmt, RX4Cmt of the plurality of time-based radar signals RXnCmt may be based on a radar signal received by an associated antenna RX1, RX2, RX3, RX4 of the plurality of antennas RX.

The plurality of time-based radar signals RXnCmt may be represented as a data cube 400, as described in context with FIG. 4.

The method may further include transforming each time-based radar signal of the time-based radar signals RXnCmt into a frequency-based radar signal, thereby forming a plurality of frequency-based radar signals RXnCmf, wherein each frequency-based radar signal of the frequency-based radar signals includes a plurality of pairs of a frequency-based-value F (in the exemplary embodiment, F1 to Fk) and an associated intensity value RXnCmfl (in 720). In other words, as illustrated in FIG. 8, each of the plurality of frequency-based radar signals RXnCmf may be binned into bins of frequencies F1 to Fk. Each of the plurality of frequency-based radar signals RXnCmf may, in various embodiments, have the same frequency bins F1 to Fk. In other words, a value of F1 may be the same for the frequency-based radar signal RX1Cmf of the first antenna RX1 and for the frequency-based radar signal RX4Cmf of the fourth antenna RX4.

As described above, the transforming may in various embodiments include a Fourier transform of the time-based radar signals, or Doppler signals derived from the Fourier transforms.

The method may further include storing the frequency-based-values F and the intensity values RXnCmfl of one frequency-based radar signal RX1Cfl corresponding to one time-based radar signal of one antenna RX1 of the plurality of antennas RX (in 730).

In the exemplary embodiment illustrated in FIG. 8, the frequency-based radar signal F, RX1C1fl corresponding to the first antenna RX1 is stored. However, the frequency-based radar signal of any other antenna RX may be used instead. As illustrated in FIG. 8, the frequency-based-values F may be stored, for example as known in the art. Furthermore, the intensity values RX1Cmfl, i.e. RX1Cmfl(F1) to RX1Cmfl(Fk), corresponding to intensity values associated with the k different frequency bins, may be stored.

The intensity values RX1Cmfl may in various embodiments be stored as floating point values 880. This means that they may be stored as a mantissa M (also referred to as significand) and an exponent E. In a case of a base of the floating point value not being pre-defined, also a base B may optionally be provided. Even though the intensity values RXnCmfl of radar data typically do not include negative values, generally, a sign bit S may optionally be provided.

The method may further include storing each intensity value RXnCmfl of the plurality of intensity values RXnCmfl of another of the plurality of frequency-based radar signals (e.g., RX2Cmf, RX3Cmf, RX4Cmf) based on a corresponding intensity value RX1C1fl, 880 of the one frequency-based radar signal RX1Cmfl, wherein a stored representation 882 of the intensity value of the other (e.g., RX2C1fl, RX3C1fl, RX4C1fl) of the plurality of frequency-based radar signals has fewer bits than the corresponding stored intensity value RX1C1fl, 880 (in 740).

"Corresponding intensity values of the one frequency-based radar signal and the other frequency-based radar signal" may be understood to be intensity values RXnCmfl that may be paired with either exactly the same frequency-based value F, i.e. may be in the same frequency bin, or may differ only slightly in their frequency-based value F, for example they may be in adjacent frequency bins or the like, for example as described above.

In the exemplary embodiment of FIG. 8, each of the stored representations of the intensity values RX2C1fl, RX3C1fl, RX4C1fl of the other of the plurality of frequency-based radar signals RX2C1f, RX3C1f, RX4C1f may consist of another mantissa M, 882, but without the exponent E (and also without the frequency-based value F and without the optional base and/or sign), such that the representation 882 contains fewer bits than the representation 880.

It is possible to omit the exponent and still retain full dynamic range and resolution, because the frequency-based radar signals RX1C1f, RX2C1f, RX3C1f, and RX4C1f of the different antennas RX are so similar to each other. This means that it is sufficient to store the exponent for each frequency bin for just one of the antennas RX (in the example, RX1). The intensities RX2C1fl, RX3C1fl, RX4C1fl of the frequency-based radar signals RX2C1f, RX3C1f, RX4C1f of the other antennas RX may be so similar to RX1C1f (and to each other), that each of the intensity values RX2C1fl, RX3C1fl, RX4C1fl may be fully restorable from the other mantissa M, 882 (in the example, the respective mantissa (or rather, mantissas) 882 stored for RX2C1fl, RX3C1fl, RX4C1fl) and the exponent E of the corresponding intensity values RX1C1fl of the one frequency-based radar signal RX1C1f. "Corresponding", again, means that, for example, for the mantissa 882 of the fourth frequency bin F4 the corresponding exponent E may be the one of the fourth frequency bin F4.

In various embodiments, the storing each intensity value of the plurality of intensity values RX2C1fl, RX3C1fl, RX4C1fl of another of the plurality of frequency-based radar signals RX2C1f, RX3C1f, RX4C1f based on a corresponding intensity value RX1C1fl, 880 of the one frequency-based radar signal RX1C1f, wherein the stored representation of the intensity value of the other of the plurality of frequency-based radar signals has fewer bits than the corresponding stored intensity value may, instead of storing the mantissa M, include storing a difference between the respective intensity value RX2C1fl, RX3C1fl, RX4C1fl of the other of the plurality of frequency-based radar signals RX2C1f, RX3C1f, RX4C1f and the intensity value RX1C1fl, 880 of the one frequency-based radar signal RX1C1f.

It may be possible to save bits by storing the difference between the respective intensity value RX2C1fl, RX3C1fl, RX4C1fl of the other of the plurality of frequency-based radar signals RX2C1f, RX3C1f, RX4C1f and the intensity value RX1C1fl, 880 of the one frequency-based radar signal RX1C1f, because the frequency-based radar signals RX1C1f, RX2C1f, RX3C1f, RX4C1f of the different antennas RX1, RX2, RX3, RX4 are so similar that the difference has a much smaller dynamic range and thus requires fewer bits for storage.

Figure 6A:
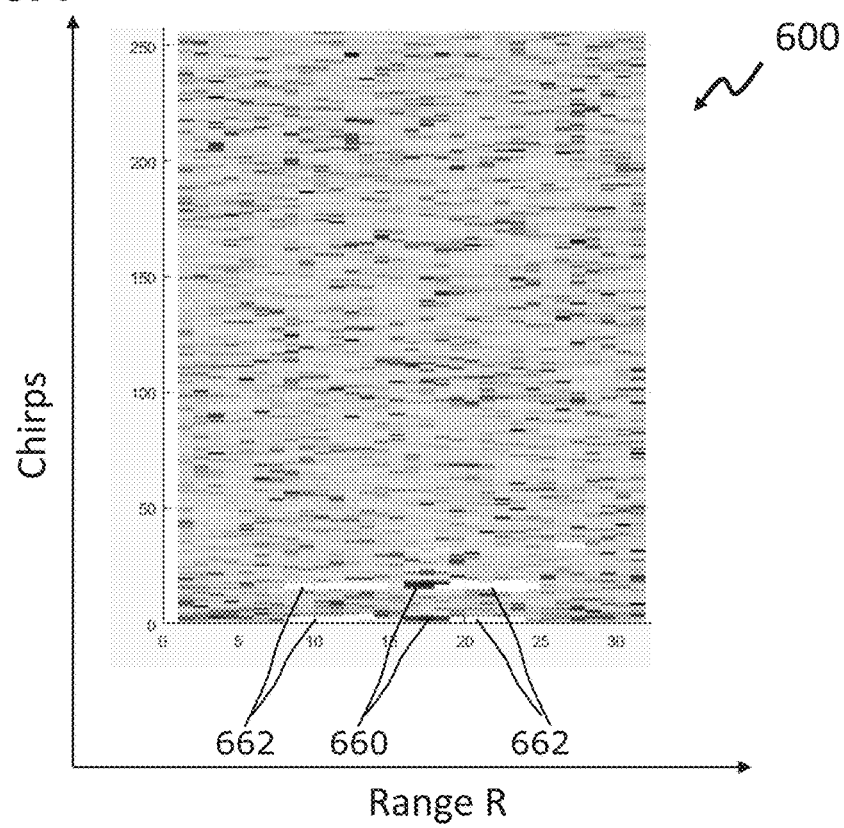
FIG. 6A shows an illustration of radar data compressed in accordance with a state of the art.
Figure 6B:
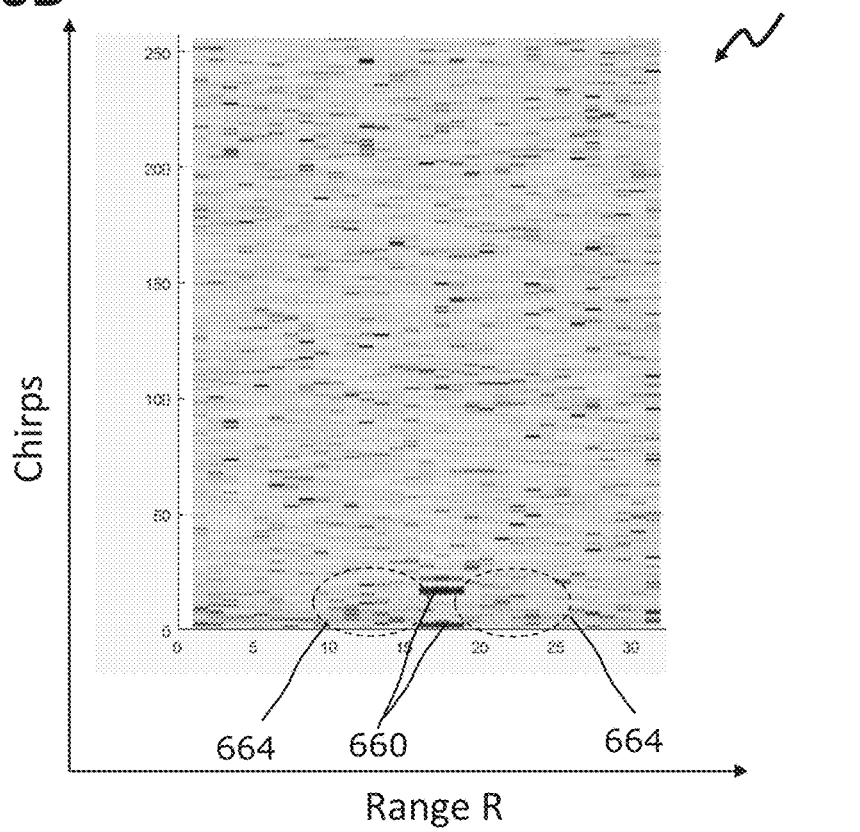
FIG. 6B shows an illustration of radar data compressed in accordance with various embodiments.

FIG. 6B shows a result 601 of the method of handling radar signals in accordance various embodiments. Like in the corresponding prior art FIG. 6A discussed above, a result of a compression of frequency-based radar data is illustrated as a two-dimensional greyscale image 601 with range bins along an x-direction, and a chirp count along a y-direction. An intensity is represented as the greyscale, wherein generally, lighter grey represents a higher intensity, except for the black regions labelled with 660, where a red, high intensity original color was converted to black in the greyscale. The bins labelled with 660 have a true, high intensity signal.

FIG. 6B illustrates that a compression of data across the antenna RX dimension, as described above in FIGS. 7 and 8, significantly improves a data loss problem that occurs in the prior art with a compression within an antenna dimension (as described above). This is particularly illustrative when comparing the (overflow-free) regions 664 of FIG. 6B with the regions 662 of FIG. 6A. Both results 600, 601 were obtained from the same radar signals.

Various examples will be illustrated in the following:

Example 1 is a method of handling radar signals of a radar system having a plurality of antennas. The method may include generating a plurality of time-based radar signals, wherein each time-based radar signal of the plurality of time-based radar signals may be based on a radar signal received by an associated antenna of the plurality of antennas, transforming each time-based radar signal of the time-based radar signals into a frequency-based radar signal, thereby forming a plurality of frequency-based radar signals, wherein each frequency-based radar signal of the frequency-based radar signals includes a plurality of pairs of a frequency-based-value and an associated intensity value, storing the frequency-based-values and the intensity values of one frequency-based radar signal corresponding to one time-based radar signal of one antenna of the plurality of antennas; and storing each intensity value of the plurality of intensity values of another of the plurality of frequency-based radar signals based on a corresponding intensity value of the one frequency-based radar signal, wherein a stored representation of the intensity value of the other of the plurality of frequency-based radar signals has fewer bits than the corresponding stored intensity value.

In Example 2, the subject-matter of Example 1 may optionally include that corresponding intensity values of the one frequency-based radar signal and the other frequency-based radar signal match in their respective paired frequency-based-values.

In Example 3, the subject-matter of Example 1 or 2 may optionally include that the frequency-based radar signals are Fourier transforms of the time-based radar signals or Doppler signals derived from the Fourier transforms.

In Example 4, the subject-matter of any of Examples 1 to 3 may optionally include that the intensity values of the one frequency-based radar signal are stored as floating point values, each including a mantissa and an exponent.

In Example 5, the subject-matter of Example 4 may optionally include that each of the stored representations of the intensity values of the other of the plurality of frequency-based radar signals consists of another mantissa, wherein each of the intensity values is restorable from the other mantissa and the exponent of the corresponding intensity values of the one frequency-based radar signal.

In Example 6, the subject-matter of Example 4 may optionally include that each of the stored representations of the intensity values of the other of the plurality of frequency-based radar signals is a difference of the intensity value of the other of the plurality of frequency-based radar signals and the intensity value of the one frequency-based radar signal.

In Example 7, the subject-matter of any of Examples 1 to 6 may optionally include that the plurality of time-based radar signals includes at least four time-based radar signals.

In Example 8, the subject-matter of any of Examples 1 to 7 may optionally include that each of the received radar signals is a reflected signal of a sent signal including a plurality of chirps.

In Example 9, the subject-matter of any of Examples 1 to 8 may optionally include that a separation between each pair of the plurality of antennas is so small that the frequency-based radar signals differ from each other essentially only by noise.

Example 10 is a radar system. The radar system may include a plurality of antennas, wherein each of the antennas may be configured to receive a radar signal, a memory, and a processor configured to generate a plurality of time-based radar signals, wherein each time-based radar signal of the plurality of time-based radar signals may be based on a radar signal received by an associated antenna of the plurality of antennas, to transform each time-based radar signal of the time-based radar signals into a frequency-based radar signal, thereby forming a plurality of frequency-based radar signals, wherein each frequency-based radar signal of the frequency-based radar signals may include a plurality of pairs of a frequency-based-value and an associated intensity value, to store the frequency-based-values and the intensity values of one frequency-based radar signal corresponding to one time-based radar signal of one antenna of the plurality of antennas in the memory, and; and to store each intensity value of the plurality of intensity values of another of the plurality of frequency-based radar signals based on a corresponding intensity value of the one frequency-based radar signal, wherein a stored representation of the intensity value of the other of the plurality of frequency-based radar signals may have fewer bits than the corresponding stored intensity value in the memory.

In Example 11, the subject-matter of Example 10 may optionally include that corresponding intensity values of the one frequency-based radar signal and the other frequency-based radar signal match in their respective paired frequency-based-values In Example 12, the subject-matter of any of Examples 9 to 11 may optionally include that the frequency-based radar signals are Fourier transforms of the time-based radar signals or Doppler signals derived from the Fourier transforms.

In Example 13, the subject-matter of any of Examples 9 to 12 may optionally include that the processor is configured to store the intensity values of the one frequency-based radar signal as floating point values, each including a mantissa and an exponent.

In Example 14, the subject-matter of Example 13 may optionally include that each of the stored representations of the intensity values of the other of the plurality of frequency-based radar signals may consist of another mantissa, wherein each of the intensity values may be restorable from the other mantissa and the exponent of the corresponding intensity values of the one In Example 15, the subject-matter of Example 13 may optionally include that each of the stored representations of the intensity values of the other of the plurality of frequency-based radar signals is a difference of the intensity value of the other of the plurality of frequency-based radar signals and the intensity value of the one frequency-based radar signal.

In Example 16, the subject-matter of any of Examples 10 to 15 may optionally include that the plurality of time-based radar signals may include at least four time-based radar signals.

In Example 17, the subject-matter of any of Examples 10 to 16 may further include at least one sending antenna, wherein each of the received radar signals may be a reflected signal of a sent signal including a plurality of chirps sent by the at least one sending antenna.

In Example 18, the subject-matter of any of Examples 10 to 17 may optionally include that a separation between each pair of the plurality of antennas is so small that the frequency-based radar signals differ from each other essentially only by noise.

In Example 19, the subject-matter of any of Examples 10 to 18 may optionally include that a separation between each pair of the plurality of antennas is in a range from about 1 mm to about 10 mm.

Example 20 is a radar system. The radar system may include a plurality of antennas, wherein each of the antennas may be configured to receive a radar signal, a memory, and a processor configured to generate a plurality of time-based radar signals, wherein each time-based radar signal of the plurality of time-based radar signals may be based on a radar signal received by an associated antenna of the plurality of antennas, and may be configured to execute the method of any of Examples 1 to 9.

While the disclosure has been particularly shown and described with reference to specific embodiments, it should be understood by those skilled in the art that various changes in form and detail may be made therein without departing from the spirit and scope of the disclosure as defined by the appended claims. The scope of the disclosure is thus indicated by the appended claims and all changes which come within the meaning and range of equivalency of the claims are therefore intended to be embraced.

What is claimed is:

1. A method of processing radar signals of a radar system comprising a plurality of antennas, the method comprising:
generating a plurality of time-based radar signals based on respective radar signals received by respective antennas of the plurality of antennas;
frequency transforming each time-based radar signal into a frequency-based radar signal that includes a plurality of pairs of a frequency-based-value and an associated intensity value; and
for each frequency-based value
storing the corresponding intensity value of a first frequency-based radar signal, wherein each intensity value of the first frequency-based radar signal is stored using a first number of bits; and
storing each respective corresponding intensity value of the remaining frequency-based radar signals, wherein each intensity value of the remaining frequency-based radar signals is stored using a second number of bits that is less than the first number of bits.

2. The method of claim 1,
wherein corresponding intensity values of the first frequency-based radar signal and the remaining frequency-based radar signals differ in their respective paired frequency-based-values.

3. The method of claim 1,
wherein the frequency-based radar signals are Fourier transforms of the time-based radar signals or Doppler signals derived from the Fourier transforms.

4. The method of claim 1,
wherein the intensity values of the first frequency-based radar signal are stored as floating point values, each including a mantissa and an exponent.

5. The method of claim 4,
wherein each of the intensity values of the remaining frequency-based radar signals is stored as a mantissa of a floating point value of the intensity value without storing an exponent of the floating point value of the intensity value.

6. The method of claim 1,
wherein each intensity values of the remaining frequency-based radar signals is a difference between the intensity value of the remaining frequency-based radar signal and the intensity value of the first frequency-based radar signal.

7. The method of claim 1,
wherein the plurality of time-based radar signals comprises at least four time-based radar signals.

8. The method of claim 4,
wherein the intensity values of the first frequency-based radar signal include bits encoding a base of the intensity value.

9. The method of claim 4,
wherein the intensity values of the first frequency-based radar signal include bits encoding a sign of the intensity value.

10. A radar system, comprising:
a plurality of antennas, wherein each of the antennas is configured to receive a radar signal;
a memory; and
a processor, configured to:
generate a plurality of time-based radar signals based on respective radar signals received by respective antennas of the plurality of antennas;
transform each time-based radar signal into a frequency-based radar signal that includes a plurality of pairs of a frequency-based-value and an associated intensity value; and
for each frequency-based value
store, in the memory, the corresponding intensity value of a first frequency-based radar signal, wherein each intensity value of the first frequency-based radar signal is stored using a first number of bits; and
store each respective corresponding intensity value of the remaining frequency-based radar signals, wherein each intensity value of the remaining frequency-based radar signals is stored using a second number of bits that is less than the first number of bits.

11. The radar system of claim 10,
wherein corresponding intensity values of the first frequency-based radar signal and the remaining frequency-based radar signals differ in their respective paired frequency-based-values.

12. The radar system of claim 10,
wherein the frequency-based radar signals are Fourier transforms of the time-based radar signals or Doppler signals derived from the Fourier transforms.

13. The radar system of claim 10,
wherein the processor is configured to store the intensity values of the first frequency-based radar signal as floating point values, each including a mantissa and an exponent.

14. The radar system of claim 13,
wherein each of the intensity values of the remaining frequency-based radar signals is stored as a mantissa of a floating point value of the intensity value without storing an exponent of the floating point value of the intensity value.

15. The radar system of claim 10,
wherein each intensity values of the remaining frequency-based radar signals is a difference between the intensity value of the remaining frequency-based radar signal and the intensity value of the first frequency-based radar signal.

16. The radar system of claim 10,
wherein the plurality of time-based radar signals comprises at least four time-based radar signals.

17. The radar system of claim 14, wherein the processor is configured to store the intensity values of the first frequency-based radar signal using bits encoding a base of the intensity value.

18. The radar system of claim 10,
wherein a separation between each pair of the plurality of antennas is so small that the frequency-based radar signals differ from each other essentially only by noise.

19. The radar system of claim 14, wherein the processor is configured to store the intensity values of the first frequency-based radar signal using bits encoding a sign of the intensity value.

* * * * *